US009972558B1

(12) United States Patent
Talledo et al.

(10) Patent No.: US 9,972,558 B1
(45) Date of Patent: May 15, 2018

(54) LEADFRAME PACKAGE WITH SIDE SOLDER BALL CONTACT AND METHOD OF MANUFACTURING

(71) Applicant: STMicroelectronics, Inc., Calamba (PH)

(72) Inventors: Jefferson Talledo, Calamba (PH); Tito Mangaoang, Pasig (PH)

(73) Assignee: STMICROELECTRONICS, INC., Calamba (PH)

(*) Notice: Subject to any disclaimer, the term of this patent is extended or adjusted under 35 U.S.C. 154(b) by 0 days. days.

(21) Appl. No.: 15/479,068

(22) Filed: Apr. 4, 2017

(51) Int. Cl.
*H01L 23/495* (2006.01)
*H01L 23/31* (2006.01)
*H01L 21/48* (2006.01)
*H01L 21/56* (2006.01)
*H01L 21/78* (2006.01)
*H01L 23/00* (2006.01)

(52) U.S. Cl.
CPC ...... *H01L 23/4952* (2013.01); *H01L 21/4825* (2013.01); *H01L 21/4828* (2013.01); *H01L 21/563* (2013.01); *H01L 21/78* (2013.01); *H01L 23/3121* (2013.01); *H01L 23/49548* (2013.01); *H01L 24/09* (2013.01); *H01L 24/11* (2013.01); *H01L 24/17* (2013.01); *H01L 24/27* (2013.01); *H01L 24/32* (2013.01); *H01L 24/46* (2013.01); *H01L 24/92* (2013.01); *H01L 2224/0401* (2013.01); *H01L 2224/04042* (2013.01); *H01L 2224/92125* (2013.01)

(58) Field of Classification Search
CPC ............. H01L 23/4952; H01L 23/3121; H01L 23/49548; H01L 24/09; H01L 24/17

USPC ......................................................... 257/666
See application file for complete search history.

(56) References Cited

U.S. PATENT DOCUMENTS

| | | | | |
|---|---|---|---|---|
| 5,045,914 | A * | 9/1991 | Casto | H01L 23/3107 257/686 |
| 5,844,315 | A * | 12/1998 | Melton | H01L 21/568 257/666 |
| 5,929,517 | A * | 7/1999 | Distefano | H01L 21/565 174/525 |
| 6,534,337 | B1 * | 3/2003 | Mahle | H01L 21/565 257/E21.504 |
| 6,650,012 | B1 * | 11/2003 | Takahashi | H01L 21/4832 257/666 |
| 6,762,118 | B2 * | 7/2004 | Liu | H01L 21/4832 257/666 |
| 6,841,414 | B1 | 1/2005 | Hu et al. | |
| 9,012,268 | B2 | 4/2015 | Jaurigue et al. | |

(Continued)

*Primary Examiner* — Nitin Parekh
(74) *Attorney, Agent, or Firm* — Seed Intellectual Property Law Group LLP

(57) ABSTRACT

The present disclosure is directed to a leadframe package having a side solder ball contact and methods of manufacturing the same. A plurality of solder balls are coupled to recesses in a leadframe before encapsulation and singulation. After singulation, a portion of each solder ball is exposed on sidewalls of the package. This ensures that the sidewalls of the leads are solder wettable, which allows for the formation of stronger joints when the package is coupled to a substrate. This increased adhesion reduces resistance at the joints and also mitigates the effects of expansion of the components in the package such that delamination is less likely to occur. As a result, packages with a side solder ball contact have increased life cycle expectancies.

20 Claims, 6 Drawing Sheets

(56) References Cited

U.S. PATENT DOCUMENTS

| | | | |
|---|---|---|---|
| 9,666,501 B2* | 5/2017 | Haga | H01L 23/3121 |
| 2008/0006940 A1* | 1/2008 | Zhou | H01L 23/3128 |
| | | | 257/737 |
| 2009/0140364 A1* | 6/2009 | Ishihara | H01L 22/32 |
| | | | 257/434 |
| 2010/0133693 A1 | 6/2010 | Arshad | |
| 2012/0205790 A1* | 8/2012 | Haga | H01L 21/4842 |
| | | | 257/676 |
| 2014/0167262 A1* | 6/2014 | Yap | H01L 21/485 |
| | | | 257/738 |
| 2016/0183369 A1 | 6/2016 | Talledo et al. | |

* cited by examiner

LEADFRAME PACKAGE WITH SIDE SOLDER BALL CONTACT AND METHOD OF MANUFACTURING

BACKGROUND

Technical Field

The present disclosure is directed to a leadframe package having a side solder ball contact in order to improve solder wettability of the lead sidewall without additional post manufacturing plating.

Description of the Related Art

A typical leadframe package includes a die having its backside coupled to a leadframe and its active side coupled to various electrical contacts. An encapsulant is then used to cover the combined die and leadframe to create the leadframe package. The resulting combination can be connected to a circuit board, such as a printed circuit board (PCB), with solder using surface mount technology (SMT).

Although SMT allows for smaller packages, it also creates some disadvantages. In particular, the solder joints between the package and the PCB can be weakened due to the PCB and the package having different coefficients of thermal expansions (CTE). Thus, the reliability of the package may, in some cases, depend on the integrity of the solder joints. But, most surface mount leadframe packages only have solder on the bottom of the package and do not have solder wettable material to form connections between the package and the circuit board. In such cases, the solder joints are weakened or cannot be formed because there is no adhesion between the solder and the sidewall of the package. This results in less contact area, a weaker bond and increased resistance with the net outcome being a less reliable package. As packages reduce in size, the available space for solder joints is further limited. Thus, strong solder bonds between the package and the PCB are desired.

Past responses to this issue have been to add a plating layer on the side of the leadframe package after manufacturing to provide for sidewall solder contact. However, plating after manufacturing requires expensive equipment and results in a less efficient manufacturing process. Further, these post plating techniques do not guarantee adequate coverage of the lead sidewall and also do not allow the resulting package-substrate combination to be inspected by automated solder inspection. Without the assistance of automated solder inspection, the solder joints cannot be properly inspected, which increases the likelihood that products will leave the manufacturing facility with problems that will manifest in a lower cycle life for the product.

BRIEF SUMMARY

Embodiments of the present disclosure are directed to leadframe packages with a side solder ball contact and methods of manufacturing the same. In one embodiment, the package has a solder ball exposed on a sidewall of the package that extends from the leadframe and into the encapsulant. When the package is attached to a substrate, solder flows between the leadframe and the substrate and forms a connection with the solder ball to create an integral solder joint that covers a sidewall of each lead. This enables strong solder joints between the leads of the package and the substrate. This also increases the solder contact area between the package and the substrate, which results in less resistance and a lower thermal load per solder pin. This reduced thermal load allows for a reduction in the number of pins required to handle the power supply load. If fewer pins are required to carry the positive and negative power supplies, then the chip can be made with fewer pins, saving money. It also allows for an increase in the number of signal and data pins in the resulting device, if needed.

Other embodiments are directed to methods of manufacturing a leadframe package with these characteristics. In an embodiment, a copper leadframe is plated on both sides before portions of the plate are removed and a plurality of recesses are formed on one side of the copper leadframe. Then, solder balls are attached to selected ones of these recesses, the die is coupled to the leadframe and wires are coupled between the die and the leadframe. An encapsulant is placed to cover the die, the wires, and the leadframe. After placing the encapsulant, the package is separated by cutting through the solder balls to produce a package with a portion of a solder ball exposed on the sidewall of the package. In other alternative embodiments of the process, the cutting process may cause a portion of the solder ball to spread onto a sidewall of the leadframe. Yet another embodiment of the process involves flowing the solder ball during the original placement in order to form a bond between the metal plating layer on the leadframe and the solder ball before continuing manufacturing. An additional alternative embodiment includes plating the leadframe after forming the plurality of recesses so that the solder balls can form a stronger connection with the metal layer. A final alternative embodiment describes plating a sidewall of the leadframe after singulation.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
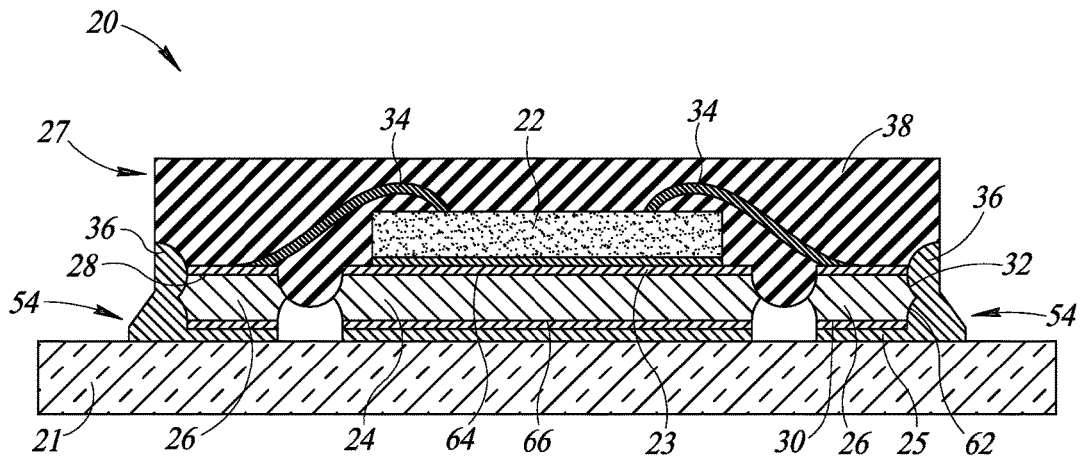
FIG. 1 is a cross-sectional view of an exemplary embodiment of a leadframe package having a side solder ball contact.

The present disclosure is generally directed to providing a package with a side solder ball contact. An exemplary embodiment of a package 20 with a side solder ball contact is shown in FIG. 1. In this embodiment, a die 22 is coupled to a metal plating layer 23 positioned on a first surface of a die pad 24. The die pad has a first surface 64 and a second surface 66, which are covered with the metal plating layer 23. A plurality of leads 26 are spaced apart from the die pad 24. Each of the plurality of leads 26 has a first side 28, a second side 30 and a sidewall 62. Each sidewall 62 has a concave region 32 on an outermost surface of each of the plurality of leads 26. The first side 28 and the second side 30 are covered by the metal plating layer 23. In other embodiments, as will be described below, the metal plating layer 23 is also positioned on the concave region 32 and on the sidewall 62 of each of the plurality of leads 26. A plurality of wires 34 coupled between the die 22 and the leads 26 provide an electrical connection between the die 22 and the leads 26. The concave region 32 on each of the leads 26 has a size and a shape for receiving one of the plurality of solder balls 36. The die 22, the wires 34 and the solder balls 36 are covered by an encapsulant 38 to form a leadframe package 20. In this embodiment, the leadframe package 20 is coupled to a substrate 21 with solder 25, although the package 20 can be manufactured and sold separately.

In the leadframe package 20, the solder balls 36 extend outward from each of the plurality of leads and into the encapsulant 38. In addition, the package 20 has a sidewall 27 with a first portion of the solder balls 36 covered by the encapsulant 38 and a second portion of the solder balls 36 exposed to an exterior environment on a first side and abutting both the encapsulant 38 and the concave region 32 of each of the plurality of leads 26 on a second side. This allows the plurality of solder balls 36 to act as a preliminary solder material to ensure maximum solder coverage of the sidewall 62 of each of the plurality of leads 26 when the package 20 is mounted to the substrate 21. Upon combining the package 20 with the substrate 21, the solder used for the coupling flows and combines with the plurality of solder balls 36 to form a plurality of integral solder portions 54 that cover the entire sidewall 62 of each of the plurality of leads 26. This coverage ensures a stronger solder joint, which helps resists the effects of differing CTE between elements in the system, thus increasing the expected cycle life of the finished package 20 over known packages. In addition, the presence of solder on the exterior of the package 20 allows the package 20 to be inspected with automated solder inspection, which enables the manufacturer to detect defects in the soldering process that could ultimately lead to lower cycle life.

Figure 2A:
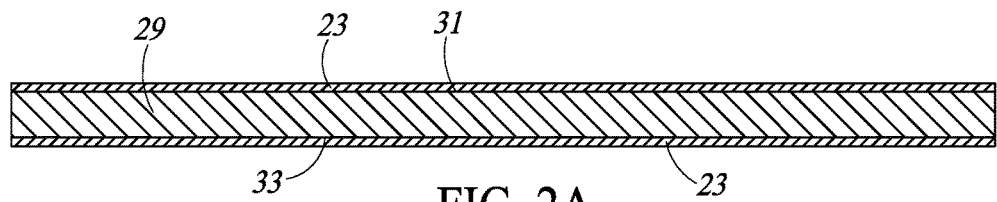
FIGS. 2A-2I are cross-sectional views of various stages of an assembly process of leadframe packages, such as the package of FIG. 1, in accordance with an embodiment of the present disclosure.

An exemplary embodiment of a method of manufacturing the package 20 is shown in FIG. 2A. In this embodiment, a leadframe 29 is plated on a first side 31 and a second side 33 with the metal plating layer 23. The leadframe 29 is typically comprised of copper or a copper alloy due its conductivity and cost advantages, although other metals may be used. The metal plating layer 23 typically consists of at least one of nickel, palladium or gold, although each of these alternatives may be used exclusive of the others in addition to other alternatives. The main reason for plating the leadframe 24 is that most solders typically form a weak mechanical bond with the copper of the leadframe. In other words, most solders used for packages form a weak mechanical bond with copper. However, nickel, palladium and gold have strong mechanical compatibility with both the solder and the copper. Therefore, the plating layer 23 acts as an intermediary between the copper and the solder in order to increase adhesion and provide for a strong bond between the solder, the plating layer 23 and the copper while maintaining desirable electrical properties. However, using different solder or leadframe materials may reduce or eliminate the need for plating.

Figure 2B:
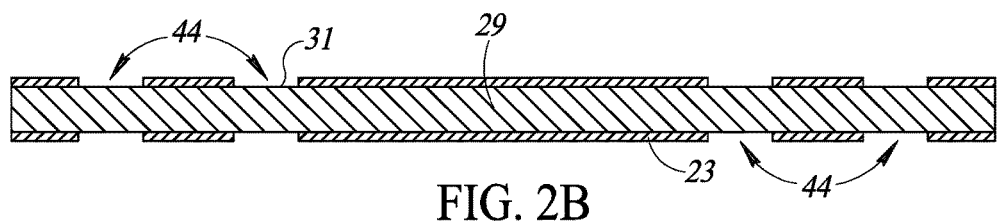
Figure 2C:
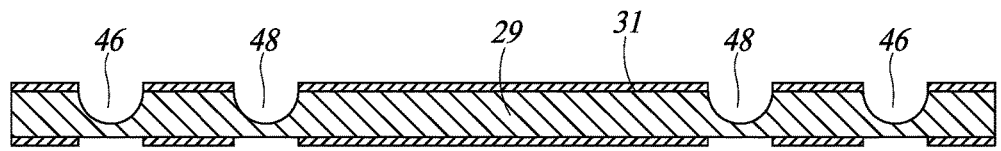

Once the plating is complete, portions 44 of the plating layer 23 are removed on both surfaces of the leadframe 29 as shown in FIG. 2B. These portions 44 can be removed with either a masking process followed by wet or dry etch, a laser, or a mechanical blade. There are many known ways to pattern a plating layer on a leadframe. In the spaces left by removing the portions 44, a first plurality of recesses 46 and a second plurality of recesses 48 are formed in a body of the leadframe 29 on the first surface 31, as in FIG. 2C. In this embodiment, forming the first plurality of recesses 46 and the second plurality of recesses 48 is done by wet etching the leadframe 29 with an etch that is selective to remove copper and not the plating layer, although other cutting, etching or forming techniques may be used in other embodiments. The first plurality of recesses 46 have a size and a shape configured to receive a solder ball.

Figure 2D:
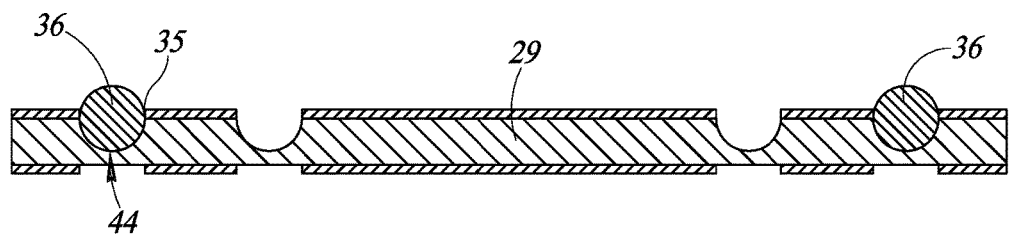
Figure 2E:
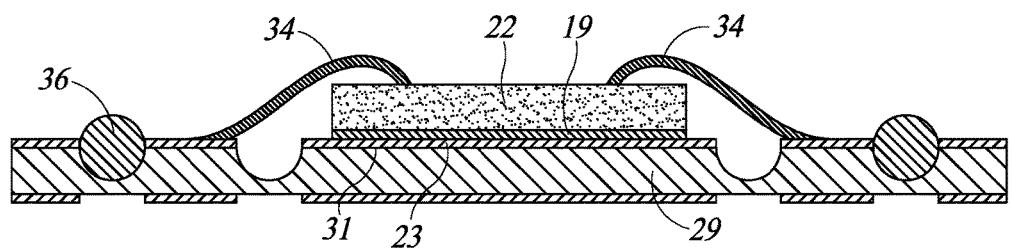
Figure 2F:
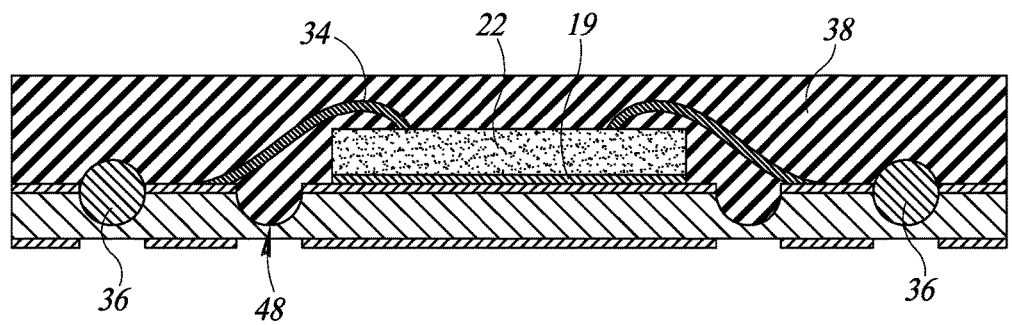

Once the recesses are formed, the plurality of solder balls 36 are coupled to each of the first plurality of recesses 44 as in FIG. 2D. In this embodiment, the solder balls 36 form an intermetallic connection with a peripheral edge 35 of each of the first plurality of recesses 44 and are placed before encapsulation and singulation. Once the solder balls 36 are in place, a die 22 is coupled to the metal layer 23 on the first surface 31 of the leadframe 29, as in FIG. 2E. The plurality of wires 34 create an electrical connection between the die 22 and the leadframe 29 and an adhesive layer 19 connects the backside of the die to the top of the leadframe 29. With these elements in place, the encapsulant 38 is added over the die 22, the plurality of solder balls 36, the plurality of wires 34 and the leadframe 29. The encapsulant 38 also fills the second plurality of recesses 48.

The encapsulant 38 is applied to the system at a selected high temperature and appropriate pressure. For example, some molding compounds will flow and form around the various components between 160 and 180 degrees Celsius. Some solders and solder balls have a melting point below this temperature. However, recent developments have created solders with a melting point at or above 200 degrees Celsius and therefore the plurality of solder balls 36 will not melt and flow when the encapsulant 38 is applied if a high temperature solder is used. The encapsulant 38 can be an acceptable molding compound, polymer, epoxy or other acceptable encapsulant having the properties described herein relative to the solder. With the solder balls 36 present when the encapsulant 38 is applied, there is balancing and tradeoff in the selection of the two components, solder and encapsulant, to select materials that are compatible with each other in the same process.

In particular, an encapsulant 38 is selected that has an application temperature which is lower than the melting temperature of the fully formed solder balls 36 for the type of solder used. This can be accomplished by having either a high temperature melting point of the solder balls 36 or a low temperature melting point of the encapsulant 38 that creates encapsulant 38. Thus, one option is to use a low temperature encapsulant 38 that will flow at a temperature lower than the melting temperature of standard solder balls 36. In addition, since the encapsulant 38 flows differently with different pressures and temperatures, and may be used in a transfer mold, a compression mold, or other type of mold, the encapsulant 38 can be selected with the properties of the solder ball 36 already known to ensure that, based on the type of molding process used, the solder balls 36 remain in the same location and remain relatively stable when subjected to the various temperatures and pressures involved in the encapsulation process. It is acceptable if the solder is brought toward the melting temperature and, perhaps, partially reflows; however, the temperature and pressure for the encapsulation process should be selected to ensure that the solder balls 36 remain substantially in the same place and shape become even more tightly bonded to the leadframe 29.

One benefit of forming the encapsulant 38 after the solder ball is present is that the additional temperature and pressure heating which the solder ball 36 undergoes will tend to more solidly attach the solder ball 36 to the leadframe 29, as well as to the plating layer 23, while at the same time solidly embedding the solder ball 36 into the encapsulant 38. In most selections of the materials for the encapsulant 38 and the solder balls 36, a combination will be selected that will cause the solder balls 36 to mechanically bond with, and be rigidly attached to, the encapsulant 38.

Figure 2G:
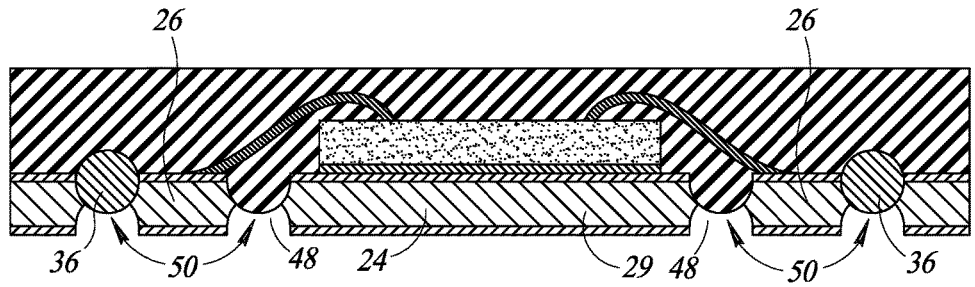

After encapsulating, remaining portions 50 of the leadframe 29 opposite the plurality of solder balls 36 and the second plurality of recesses 48 are removed as shown in FIG. 2G. Removing these portions 50 isolates the die pad 24 from the plurality of leads 26 so that an improper electrical connection does not short the leads to each other. The removal of the backside of leadframe 29 can be carried out by any acceptable technique, such as etching with a chemical etch that is selective to etch the leadframe material and not the plating layer 23, by laser cutting, a mechanical blade or other acceptable technique.

Figure 2H:
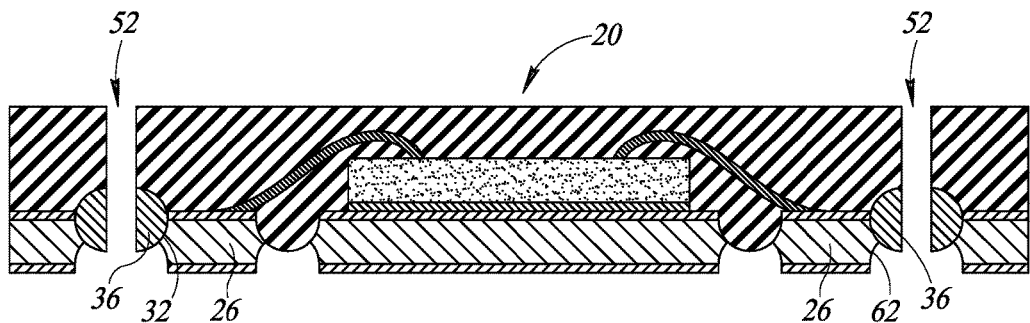

As shown in FIG. 2H, a mechanical blade or other dicing technique is used to separate the resulting package 20 at the locations 52. As shown, the locations 52 correspond to approximately a midpoint of the plurality of solder balls 36, although it is possible to make the cut such that a different proportion of the plurality of solder balls 36 remains. In addition, removing the portions 50 and separating the package 20 from the remaining material at locations 52 after the solder balls 36 are coupled to the leadframe 29 ensures that the solder balls 36 occupy the concave region 32 of each of the plurality of leads 26. In this embodiment, the concave regions 32 are a top side recess filled with a solder ball 36. The solder ball 36 has a portion remaining that allows the solder to flow down and cover the entire sidewall 62 of each of the plurality of leads 26 during reflow when the package 20 is attached to the substrate 21. This helps to ensure complete solder coverage of the sidewall 62 and results in a stronger solder joint.

Figure 2I:
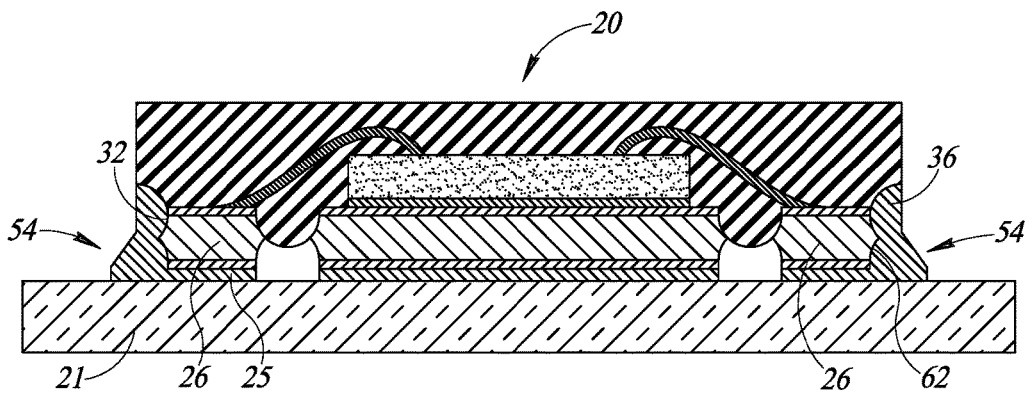

Next, as shown in FIG. 2I, the package 20 is coupled to the substrate 21 with solder 25. When the solder 25 flows between the plurality of leads 26 and the substrate 21, the solder 25 joins with the plurality of solder balls 36 to form the plurality of integral solder portions 54. The integral solder portions 54 extend beyond the sidewall 62 and the concave region 32 of each of the plurality of leads 26, which creates additional strength against the effects of different CTEs between the materials in the package 20 compared to packages without solder wettable sides.

If the package is attached to a substrate where the solder must be heated to about 200 degrees Celsius, then there might be a concern that the encapsulant 38, which is of a thermoset type in this embodiment, would degrade or decompose. However, once the encapsulant 38 is cured by heat and pressure during the encapsulation process, then the thermoset encapsulant 38, does not degrade and cannot be reshaped by melting and reprocessing at standard solder melting temperatures. Instead, if the encapsulant 38 is a thermoset type, it does not experience any significant degrading at temperatures below 400 degrees Celsius. Thus, only if the temperature is raised above 400 degrees Celsius after curing does degradation or decomposition of the encapsulant 38 become an issue of concern, which is well above any solder application or reflow temperatures.

In alternative embodiments, it is possible to use an encapsulant comprised of thermoplastic, which can be reshaped by melting and reprocessing after curing. In this case, the concern is that the encapsulant would liquefy during the solder application and reflow process. However, a thermoplastic material may be selected, based on its properties, to be compatible with the solder as mentioned above. In other words, curing the thermoplastic encapsulant can raise the melting point of the encapsulant to above 300 degrees Celsius, which is above that of the melting point of the solder to be used.

Thus, soldering the package to the substrate will not raise the temperature of the encapsulant to a point where it will begin to melt. Having the solder balls partially embedded in the encapsulant can therefore be safely used with both a thermoset and a thermoplastic encapsulant.

The solder balls 36 and the encapsulant 38, whether of a thermoset or a thermoplastic type, can be used in combination in a final package, while, of course, there will be time and temperature monitoring in the final soldering of the package to the substrate 21. Namely, the encapsulant 38, after it is cured, whether by UV curing, additional heat after the first mold flow, a hardener which becomes more rigid over time as it cures, or other curing technique, will remain rigid at extremely high temperatures. For example, an encapsulant 38 of a thermoset type is selected which, during the encapsulation process may flow at a temperature range between 140 to 180 degrees Celsius and then, after full curing, will remain solid and will not degrade or decompose even though the temperature may exceed 400 degrees Celsius. Such encapsulant 38, which prior to being cured has good flow properties below 180 degrees Celsius, can after curing remain a solid at temperatures above 400 degrees Celsius, are well known in the art and commercial available from a number of suppliers. One of ordinary skill in the art can use such an encapsulant 38 having these properties with a solder having complementary properties as disclosed herein.

Figure 3:
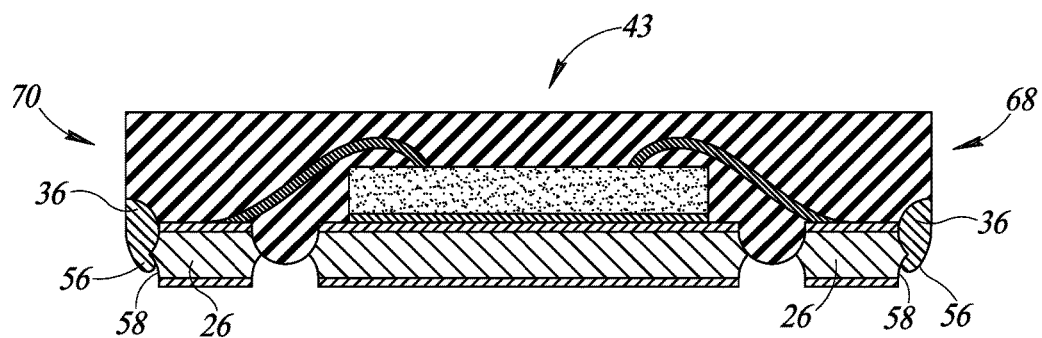
FIG. 3 is an alternative embodiment of a leadframe package with a portion of the side solder ball contact smeared onto a sidewall of the leadframe.

In an alternative embodiment shown in FIG. 3, separating the package with a mechanical blade or other dicing techniques creates enough force to smear or otherwise spread the solder ball 36. This smearing or spreading of the solder ball 36 can be accomplished by a number of techniques. For example, the mechanical motion of a moving blade may cause pressure against the exposed portion of the solder ball 36, as shown in FIG. 2H, that is above the concave portion and may press it somewhat into the concave region 62. Thus, the mechanical pressure of a blade contacting the solder ball 36 will press some of the solder ball material, some from the upper portion of the solder ball, to be depressed into and fill some of the concave region 62 in the leadframe 29. This causes a portion 56 of the first solder ball to press down into this region and create a stronger contact to the lead 26. Alternatively, the singulation of the package, whether by cutting with a blade or laser cutting, may raise the temperature of the solder balls 36 at the cut interface to a point slightly melting the solder material that comprises the plurality of solder balls 36 so that a spreading or smearing occurs. In this case, the heat causes a portion 56 of a first solder ball to flow down, or "smear," onto a lead portion 58 of a first sidewall 68 of the package 43. Similarly, a portion 56 of a second solder ball is smeared onto the lead portion 58 of a second sidewall 70 of the package 43. This result is advantageous because it decreases the separation distance between the plurality of solder balls 36 of the package 43 and a substrate. As such, solder that is added when coupling the package 43 to the substrate will not have to flow as far in order to form a connection with the plurality of solder balls 36. This decrease in flow distance helps to ensure that any solder added when connecting the package 43 to the substrate will form a complete connection, or in other words, will flow completely to the plurality of solder balls 36 in order to form the plurality of integrated solder pieces described above.

Figure 4A:
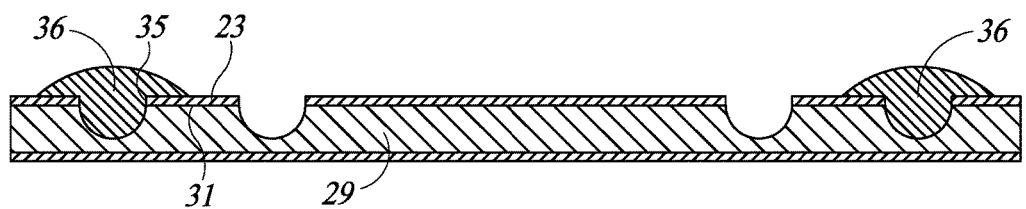
FIGS. 4A and 4B are cross-sectional views of an alternative embodiment of various stages of a leadframe package assembly process where the solder ball is flowed over a portion of a metal plating layer on the leadframe during assembly.
Figure 4B:
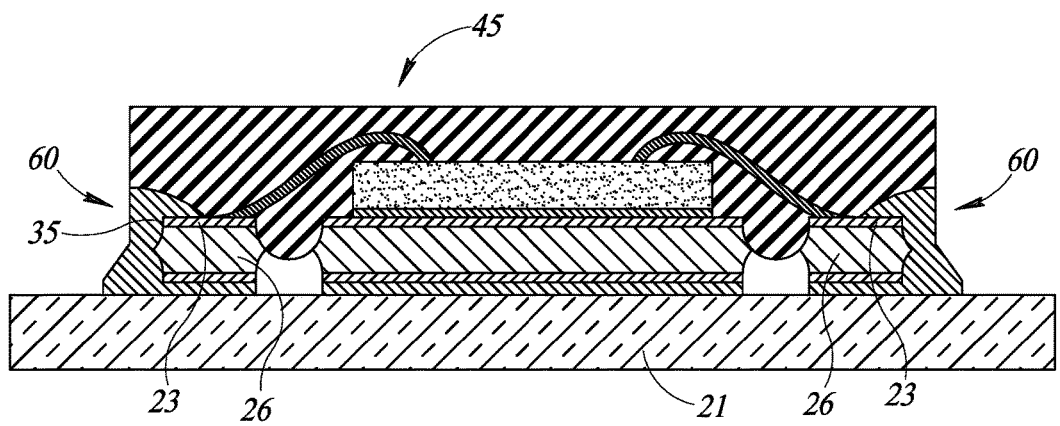

FIG. 4A shows an alternative embodiment of a process for forming a leadframe package 45 with a side solder ball contact. In some cases, a stronger connection is desired between the plurality of solder balls 36 and the leadframe 29. In these circumstances, the plurality of solder balls 36 can be reflowed after deposition beyond the peripheral edge 35 so that the solder balls 36 form an intermetallic connection with the metal plating layer 23 on the first surface 31 of the leadframe 29. A larger amount of solder for the balls 36 can be added and then a solder reflow heat treatment step performed to cause the solder ball 36 to spread out into the layer 31, as shown in FIG. 4A. Then, the process continues as described above with respect to FIGS. 2A-I. The end product, shown in FIG. 4B, has a plurality of integral solder portions 60 where a portion of the solder ball 36 extends beyond the peripheral edge 35 and contacts the metal plating layer 23 on each of the plurality of leads 26. Increasing the contact area between the plurality of integral solder portions 60 and the metal layer 23 further increases the strength of the solder joints formed between the leadframe package 45 and the substrate 21. In addition, forming the bond between the metal layer 23 and the plurality of solder balls 36 when the solder balls 36 are placed ensures that the solder balls 36 remain in their proper location during the various processing steps.

Figure 5A:
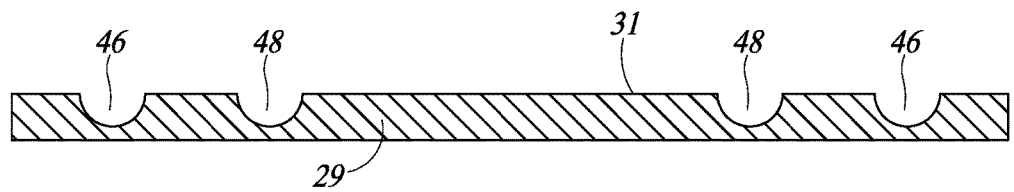
FIGS. 5A-5D are cross-sectional views of an alternative embodiment of various stages of a leadframe package assembly process where a plurality of recesses are plated with a metal plating layer before a solder ball is attached to select recesses.
Figure 5B:
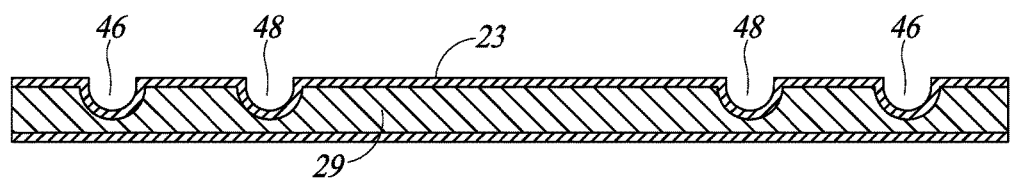
Figure 5C:
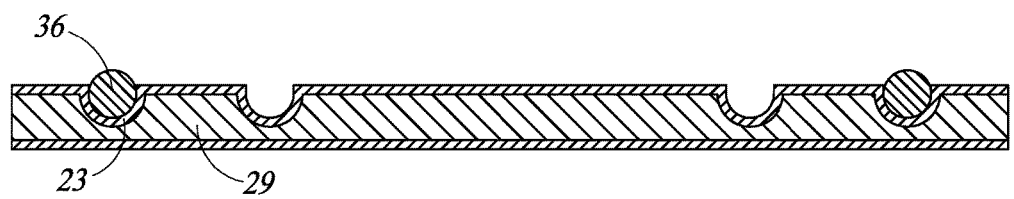

An alternative embodiment of a process for manufacturing a leadframe package with a side solder ball contact is shown in FIG. 5A. In this embodiment, the first plurality of recesses 46 and the second plurality of recesses 48 are formed in the body of the leadframe 29 from the first surface 31 before the plating layer 23 is added. Once the recesses are formed, the metal plating layer 23 is formed on the leadframe 29 as in FIG. 5B. Notably, the metal plating layer 23 covers the first plurality of recesses 46 and the second plurality of recesses 48. This allows the plurality of solder balls 36 to form a strong intermetallic connection with the metal plating layer 23 when the solder balls 36 are coupled to the leadframe 29, as in FIG. 5C. This increased bond reduces the likelihood that the different CTE between the various metals in the final package will result in separation, or delamination, of the solder balls 36 from the leadframe 29. In addition, this provides additional mechanical strength to assist the solder balls 36 to remain in their intended positions during the rest of the processing steps.

Figure 5D:
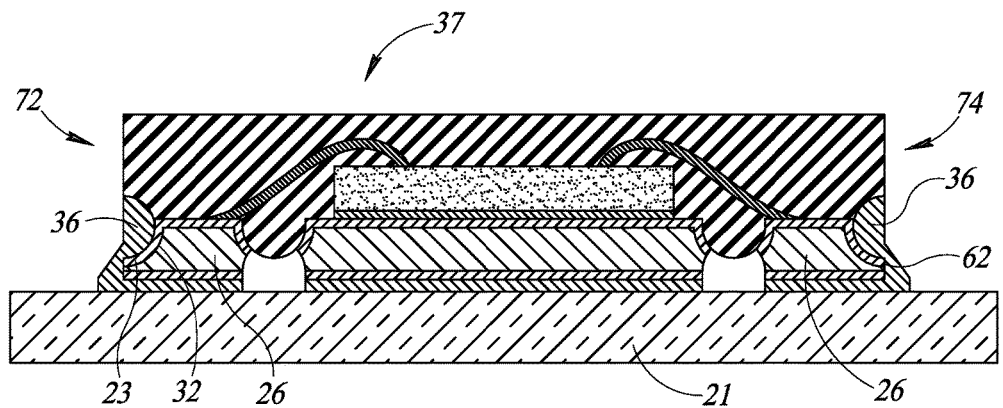

After coupling the solder balls 36 to the metal layer 23, the process continues as in other embodiments until a leadframe package 37 is formed, as in FIG. 5D. The package 37 has a portion of each solder ball 36 exposed on a first sidewall 74 and a second sidewall 72 of the package 37. The leadframe package 37 differs from other embodiments because the metal layer 23 covers the concave region 32 of each of the plurality of leads 26. As such, a strong bond forms between the plurality of solder balls 36 and the concave region 32, which further increases the integrity of the solder joints that are formed between the plurality of leads 26 and the substrate 21. However, this embodiment does not include having the metal layer 23 positioned on a sidewall 62 of each of the plurality of leads. In order to achieve such an arrangement, a different process may be utilized.

Figure 6:
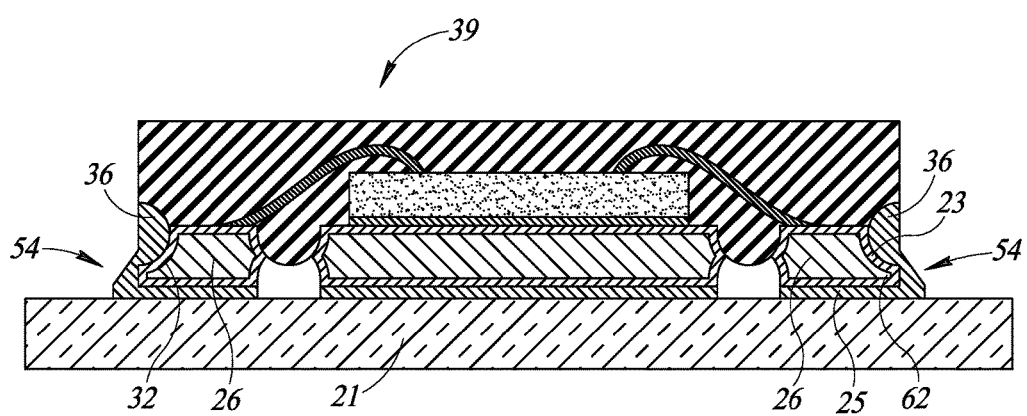
FIG. 6 is an alternative exemplary embodiment of a leadframe package having a metal plating layer on a sidewall of each of a plurality of leads in the package.

An alternative embodiment of a leadframe package 39 is shown in FIG. 6. In this embodiment, the metal layer 23 is formed on the sidewall 62 of each of the plurality of leads 26. As such, the sidewall 62 and the concave region 32 of each of the plurality of leads 26 can form a strong bond with the solder 25 and the plurality of solder balls 36. To create a package 39 with these characteristics, the manufacturing process begins similar to the process described with respect to FIGS. 5A-C. However, once the leadframe 29 is etched from the bottom side singulation, as in FIG. 2G, the remaining portion of the sidewall is plated with the metal layer 23. Namely, after step 2G is performed, the underside of the leadframe 29 has a plating layer 23 applied across the entire underside. This may serve to somewhat thicken the lower layer while at the same time placing a plating layer 23 on the concave portions of the leadframe 29 and the die pad 24. This additional plating layer 23 can be formed by electroplating, simple blanket deposition, or other technique on the backside of the leadframe assembly 29 shown in FIG. 2G.

While this requires an additional manufacturing step, positioning the metal layer on the sidewall 62 of each of the leads 26 allows solder to flow onto the metal layer 23 covering the sidewall 62 when the leadframe package 39 is attached to the substrate 21. This maximizes the contact area between a plurality of integral solder portions 54 and each of the plurality of leads 26, which, in turn, maximizes the solder joint strength between the plurality of leads 26 and the substrate 21.

As will be appreciated, only a single leadframe 29 is shown in FIGS. 2A-2H; however, the leadframe 29 will typically be one in an array several hundred or, perhaps, several thousand leadframes that are connected in a single contiguous strip in a manner well known in the art. The die are placed at the appropriate place on the leadframe array in which many hundreds or thousands of die are present with the plating, wire bonding, soldering, applying the encapsulant 38, and completing the encapsulation occurs on the large array with many thousands being encapsulated at the same time. After this process, shown in FIG. 2H, the individual packages are singulated to obtain the final package as shown in the respective figures, such as FIGS. 2I, 4B, 5 and 6.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
 a die coupled to a die pad;
 a plurality of leads spaced apart from the die pad, each of the plurality of leads having a first side, a second side and a sidewall, the sidewall having a concave region on an outermost surface;
 a plurality of wires, each of the plurality of wires coupled between the die and one of the plurality of leads;
 a plurality of solder balls, each of the plurality of solder balls coupled to a respective concave region of each sidewall of each of the plurality of leads, each of the plurality of solder balls extending outward from each of the plurality of leads; and
 an encapsulant that encases the die, the plurality of wires, and a first portion of each of the plurality of solder balls, a second portion of each of the plurality of solder balls having a first side exposed to an exterior environment and a second side abutting both the encapsulant and one of the plurality of leads.

2. The device of claim 1 further including:
 a metal plating layer positioned on a first surface and a second surface of the die pad and on the first side and the second side of each of the plurality of leads.

3. The device of claim 2 wherein the coupling between each of the plurality of solder balls and each of the plurality of leads further comprises an intermetallic connection between each of the plurality of solder balls and a peripheral edge of the metal plating layer positioned on the first side of each of the plurality of leads.

4. The device of claim 3 wherein the coupling further comprises an intermetallic connection between each of the plurality of solder balls and the metal plating layer on the first side of one of the plurality of leads.

5. The device of claim 2 further comprising the metal plating layer positioned on the concave region of each of the plurality of leads.

6. The device of claim 5 wherein the coupling between each of the plurality of solder balls and each of the plurality of leads further comprises an intermetallic connection between each of the plurality of solder balls and the metal plating layer on the concave region of each of the plurality of leads.

7. The device of claim 1 further including:
 a substrate coupled to the die pad and to each of the plurality of leads with solder; and
 a plurality of integral solder portions, each of the plurality of integral solder portions comprised of one of the plurality of solder balls and the solder between the substrate and one of the plurality of leads.

8. A device, comprising:
 a die coupled to a die pad having a first side and a second side;
 a lead having a first side, a second side and a sidewall, the sidewall having a concave region on an outermost surface;
 a wire coupling the die to the lead;
 a solder ball coupled to the concave region of the sidewall of the lead; and
 an encapsulant that covers the die, the wire and a first portion of the solder ball, the first portion of the solder ball abutting and coupled to the encapsulant, a second portion of the solder ball being exposed to an exterior environment.

9. The device of claim 8 further including:
 a substrate coupled to the die pad and the lead with solder; and
 an integral solder portion, the integral solder portion comprised of the solder ball and the solder between the substrate and the lead.

10. The device of claim 9 wherein the encapsulant is a thermoset or thermoplastic encapsulant.

11. The device of claim 10 wherein the thermoset or thermoplastic encapsulant has a melting temperature that is greater than that of the solder.

12. The device of claim 8 further including:
 a first metal layer coupled to the first sides of the die pad and the lead; and
 a second metal layer coupled to second sides of the die pad and the lead, the second sides being opposite the first sides.

13. The device of claim 12 wherein the first metal layer is coupled to the concave region of the lead.

14. The device of claim 12 wherein the coupling between the solder ball and the lead further comprises an intermetallic connection between the solder ball and a peripheral edge of the first metal layer coupled to the first side of the lead.

15. The device of claim 14 wherein the intermetallic connection between the solder ball and the peripheral edge of the first metal layer coupled to the first side of the lead further comprises a portion of the solder ball that covers the peripheral edge of the first metal layer and covers a portion of the first side of the lead.

16. The device of claim 8 further including:
 a metal layer coupled to the lead and the die pad, the metal layer encasing the lead and the die pad.

17. A device, comprising:
 a lead having a first surface, a second surface and a sidewall, the sidewall having a first concave region and a second concave region;

a die pad having a first surface and a second surface, the first surface of the die pad being aligned with the first surface of the lead;

a die coupled to the die pad by an adhesive material;

a wire coupled between the die to the lead;

a singulated solder ball coupled to the lead, a first portion of the solder ball coupled to the first concave region, a second portion of the solder ball coupled to the second concave region; and an encapsulant that covers the die, the wire and a first surface of the solder ball, the first surface of the solder ball abutting and coupled to the encapsulant, a second surface of the solder ball being exposed to an exterior environment.

18. The device of claim 17 further including:

a first metal layer covering the first surface of the lead and the first surface of the die pad; and a second metal layer covering the second surface of the lead and the second surface of the lead.

19. The device of claim 17 further including:

a substrate coupled to the die pad and the lead with solder; and an integral solder portion, the integral solder portion comprised of the solder ball and the solder between the substrate and the lead.

20. The device of claim 19 wherein the second portion of the solder ball coupled to the second concave region of the lead forms the integral solder portion comprised of the solder ball and the solder between the substrate and the lead.

\* \* \* \* \*